US012560654B2

(12) United States Patent
Simonis et al.

(10) Patent No.: US 12,560,654 B2
(45) Date of Patent: Feb. 24, 2026

(54) METHOD AND SYSTEM FOR EFFICIENTLY MONITORING BATTERY CELLS OF A DEVICE BATTERY IN AN EXTERNAL CENTRAL PROCESSING UNIT USING A DIGITAL TWIN

(71) Applicant: Robert Bosch GmbH, Stuttgart (DE)

(72) Inventors: Christian Simonis, Leonberg (DE); Christoph Kroener, Freiberg Am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 508 days.

(21) Appl. No.: 18/068,599

(22) Filed: Dec. 20, 2022

(65) Prior Publication Data

US 2023/0213587 A1 Jul. 6, 2023

(30) Foreign Application Priority Data

Jan. 3, 2022 (DE) .......................... 102022200008.0

(51) Int. Cl.
| | |
|---|---|
| *G01R 31/367* | (2019.01) |
| *G01R 31/392* | (2019.01) |
| *G01R 31/396* | (2019.01) |

(52) U.S. Cl.
CPC ......... *G01R 31/367* (2019.01); *G01R 31/392* (2019.01); *G01R 31/396* (2019.01)

(58) Field of Classification Search
CPC .. G01R 31/367; G01R 31/392; G01R 31/396; Y02T 10/70; Y02T 10/72; B60L 58/16;
(Continued)

(56) References Cited

U.S. PATENT DOCUMENTS

| | | | |
|---|---|---|---|
| 9,551,759 B2 * | 1/2017 | Yazami | ...................... H02J 7/00 |
| 11,300,628 B2 * | 4/2022 | Guo | ........................ H01M 10/48 |

(Continued)

FOREIGN PATENT DOCUMENTS

| | | |
|---|---|---|
| DE | 10 2015 005 119 A1 | 12/2015 |
| DE | 10 2020 212 732 A1 | 11/2021 |

(Continued)

OTHER PUBLICATIONS

Weihan Li, Monika Rentemeister, Julia Badeda, Dominik Jost, Dominik Schulte, Dirk Uwe Sauer, Digital twin for battery systems: Cloud battery management system with online state-of-charge and state-of-health estimation, Journal of Energy Storage, vol. 30, (Year: 2020).*

(Continued)

*Primary Examiner* — Huy Q Phan
*Assistant Examiner* — Martin Walter Braunlich
(74) *Attorney, Agent, or Firm* — Maginot, Moore & Beck LLP

(57) ABSTRACT

The disclosure relates to a method for monitoring battery cells and continuously providing cell aging states of battery cells of a device battery. The method includes providing temporal cell-operating value profiles of operating values for each of the battery cells and determining cell aging states of each battery cell based on one or more aging state models, respectively, depending on cell-operating value profiles provided with a high temporal resolution, after a respective evaluation period. The method includes selecting a portion of the battery cells for continuously capturing the cell-operating value profiles with the high temporal resolution in the respective next evaluation period, and continuously providing the cell-operating value curves of the selected battery cells with the high temporal resolution in the next evaluation period, while for remaining battery cells of the (Continued)

device battery no operating values or cell-operating value curves with low temporal resolution are provided.

14 Claims, 3 Drawing Sheets

(58) Field of Classification Search
CPC .. B60L 3/0046; B60L 58/10; H01M 2220/20; H01M 10/482; H01M 10/48; H01M 10/486; H01M 2010/4278; Y02E 60/10
See application file for complete search history.

(56) References Cited

U.S. PATENT DOCUMENTS

| | | | | |
|---|---|---|---|---|
| 11,835,583 B1 * | 12/2023 | Katrašnik | ............... | H02J 7/005 |
| 11,946,978 B2 * | 4/2024 | Arzberger | ............. | H02J 7/0048 |
| 12,032,033 B2 * | 7/2024 | Shim | ...................... | G01R 19/30 |
| 12,061,240 B2 * | 8/2024 | Kasselman | ....... | H01M 10/4257 |

| | | | | |
|---|---|---|---|---|
| 2012/0038322 A1 | | 2/2012 | Moorhead et al. | |
| 2015/0323610 A1 * | | 11/2015 | Ahn ..................... | H01M 10/486 |
| | | | | 320/152 |
| 2023/0306152 A1 * | | 9/2023 | Gering ................. | G01R 31/392 |

FOREIGN PATENT DOCUMENTS

| | | |
|---|---|---|
| DE | 10 2020 206 592 A1 | 12/2021 |
| EP | 2 901 709 B1 | 11/2016 |

OTHER PUBLICATIONS

Wang, Wenwen et al. "Application of Digital Twin in Smart Battery Management Systems." Chinese journal of mechanical engineering 34.1 (2021): 1-19. Web. (Year: 2021).*
X. Qu, Y. Song, D. Liu, X. Cui, Y. Peng, Lithium-ion battery performance degradation evaluation in dynamic operating conditions based on a digital twin model, Microelectronics Reliability, vol. 114, (Year: 2020).*

* cited by examiner

METHOD AND SYSTEM FOR EFFICIENTLY MONITORING BATTERY CELLS OF A DEVICE BATTERY IN AN EXTERNAL CENTRAL PROCESSING UNIT USING A DIGITAL TWIN

This application claims priority under 35 U.S.C. § 119 to patent application no. DE 10 2022 200 008.0, filed on Jan. 3, 2022 in Germany, the disclosure of which is incorporated herein by reference in its entirety.

The disclosure relates to systems in which a plurality of device batteries is monitored by an external central processing unit. The disclosure further relates to methods for reducing a number of operating values of the device batteries to be transmitted to an external central processing unit.

BACKGROUND

The supply of energy to network-independently operated electrical devices and machines, such as electrically drivable motor vehicles, as a rule takes place by means of device batteries or vehicle batteries. The latter supply electrical energy for operating the devices.

Device batteries degrade over their service life and depending on their load or usage. This so-called aging leads to a continuously decreasing maximum power or storage capacity. The aging state corresponds to a measure for indicating the aging of energy stores. In accordance with the convention, a new device battery may have a 100% aging state (regarding its capacity, SOH-C) which increasingly decreases over the course of its service life. A degree of aging of the device battery (change in the aging state over time) depends on an individual load on the device battery, i.e., in the case of vehicle batteries of motor vehicles, on the usage behavior of a driver, external ambient conditions and on the type of vehicle battery.

In order to monitor device batteries from a plurality of devices, operating value data is typically continuously captured and, as operating value profiles, are transmitted in block fashion to an in-device central processing unit. In the case of device batteries having a plurality of battery cells, the operating values may be captured at the cell level and transmitted to the central processing unit in compressed form. To evaluate the operating value data, in particular to determine aging states in models based on differential equations, the operating value data is scanned with a comparatively high temporal resolution (scanning frequencies) of, for example, between 1 and 100 Hz and an aging state is determined therefrom using a time integration method.

In addition, device batteries having large stored powers may comprise up to several thousand battery cells per device battery. A cell aging state is then determined for each individual battery cell. A total aging state is now determined from the cell aging states according to the topology and configuration of the device battery. In order to continuously determine the cell aging states for each battery cell, the availability of the operating value data for all battery cells is therefore necessary, so that a high volume of data for each device battery to be monitored in the central processing unit must be received and evaluated.

A challenge is that with a high number of battery cells, there is a high amount of data transfer between the device battery and the central processing unit (Cloud), which can lead to delays in providing operating value data in a limited amount of bandwidth.

SUMMARY

According to the present disclosure, a method for monitoring battery cells of a device battery in a system with device batteries of a plurality of devices that are in communication with an external central processing unit according to the disclosure as well as a corresponding system according to the disclosure is provided.

Further embodiments are specified in the disclosure.

According to a first aspect, a method of monitoring battery cells and continuously providing cell aging states of battery cells of a device battery is provided, with the following steps:

providing temporal operating values for each of the battery cells to cell-operating values;

determining cell aging states of each battery cell based on one or more aging state models, respectively, depending on cell-operating value profiles provided with a high temporal resolution after a respective evaluation period;

selecting a portion of the battery cells for continuously recording the operating value profiles with the high temporal resolution in the respective next evaluation period;

continuously providing the cell-operating value profiles of the selected battery cells with the high temporal resolution during the next evaluation period, while for remaining battery cells of the device battery no operating values or cell-operating value profiles with low temporal resolution are provided.

The aging state of a device battery is usually not directly measured. This would require a number of sensors inside the device battery that would make the production of such a device battery cost-intensive, as well as complex, and would increase the space requirement. Moreover, measurement methods suitable for everyday use for direct determination of the aging state in the energy stores are not yet available on the market.

Monitoring of device batteries of a plurality of devices is therefore carried out in an external central processing unit for reasons of capacity. For this purpose, the devices transmit operating value profiles of operating values of the device batteries to the central processing unit, wherein a current electrochemical state and/or aging state is determined in the central processing unit. Depending on the model used, time series of operating values are continuously recorded as operating value curves, for example battery current, battery temperature, state of charge and/or battery voltage, and transmitted to the central processing unit in block fashion and optionally in compressed form. There, the operating value profiles are evaluated so that a device-specific state and, if necessary, further variances can be calculated/determined based on one or more aging state models. In addition, the operating values from the plurality of device batteries may be evaluated using statistical methods to improve the applied aging state models so that the determination and prediction of the aging state of the device batteries may be increasingly improved.

In the case of device batteries, the aging state (state of health, SOH) is the key variable to indicate a remaining battery capacity or remaining battery charge. The aging state represents a measure of the aging of the device battery. In the case of a device battery or a battery module or a battery cell, the aging state may be indicated as a capacity retention rate (SOH-C). The capacity maintenance rate SOH-C, i.e. the capacity-related state of aging, is given as the ratio of the measured instantaneous capacity to an initial capacity of the fully charged battery and decreases with aging. Alternatively, the aging state may be given as an increase in internal resistance (SOH-R) with respect to internal resistance at the start of the service life of the device battery. The relative change in the internal resistance SOH-R increases with increasing aging of the battery.

Device batteries typically comprise a plurality of battery cells, which may be monitored separately. This can be done by simulating the states of the battery cells in a computing unit in the form of a "digital twin", in particular using a self-recognized battery performance model.

The battery performance model includes a differential equation system that models internal equilibrium conditions based on differential equations parameterized via battery model parameters and provides a state of charge of the battery cells of the device battery based on a relationship between operating values of the battery cells of the device battery, namely a battery current, a battery voltage, and a battery temperature. Model parameters of the battery performance model may be fitted with cell-operating values curves of the battery cells within a limited time period, wherein electrochemical, kinetic parameters may be derived, e.g. electrolyte concentrations, reaction rates, layer thicknesses, porosities, etc.

The electrochemical battery performance model may be adjusted for each of the battery cells based on cell-operating values sensed in at rest phases within short periods of time (a few hours). Based on the fitted electrochemical model parameters, the cell aging state may be determined.

An age-dependent neutral voltage characteristic can be calculated analytically via a batch algorithm, so that by the adjustment of the idle voltage, the conclusion of detailed electrochemical model parameters of the electrochemical battery model and thus the direct determination of the aging state of the battery cells is possible directly.

The model parameters of the electrochemical battery performance model may be re-parameterized at regular intervals, especially if there is sufficient new data on measured charging conditions and battery sizes. This data may be collected for similar device batteries by evaluation in a central processing unit and adjustment or re-parameterization can be performed there. Adjustment of the model parameters of the electrochemical battery performance model may be accomplished by fitting the battery performance model to the available data, e.g., using a least-square-method or the like.

Such model parameters may include, for example, a scale indication of the cyclable lithium (value refers to the cathode capacity), the proportion of the cyclable lithium at the start of life of the battery (scale value), a volume fraction of the anode, and a volume fraction of the anode at the start of life of the device battery. The aging state of the respective battery cell may be determined as a linear combination of the model parameters and/or the internal states approximately.

In particular, the monitoring serves to detect low-performing and/or susceptible battery cells and to prevent them from being overloaded during a charging process. Furthermore, to determine an aging state of the entire device battery, the cell aging states are determined and these are offset against each other according to the topology or the configuration of the device battery with respect to the arrangement and circuitry of the battery cells in order to determine the aging state for the entire device battery. For example, the capacity-related state of aging can be determined from the battery cells connected in parallel and serially on the basis of the Kirchhoff's node and mesh rule.

For this reason, it is contemplated to continuously update and monitor the current individual electrochemical state and/or aging state of the battery cells of one or more device batteries (as cell-aging states) in the central processing unit. This represents a remotely implemented "digital twin" of the respective device battery, since cell aging states for the individual battery cells of each of the monitored device batteries are always up-to-date in the central processing unit.

However, this would normally require the transmission of operating value profiles of each of the battery cells of the device battery in a high temporal resolution, which would require very high amounts of data to be transmitted from all devices to the central processing unit.

However, this data transfer can be reduced by employing simulation models, such as the battery performance model (battery performance model), in the digital twin that are regularly calibrated with timely high resolution cell-operating value profiles and for the remainder only require cell-operating value profiles available at lower scanning frequencies. Thus, the bus load for sensing the operating value curves in the vehicle, e.g. on the CAN bus, can be minimized by only capturing the cell operating value curves for some of the battery cells in high resolution (at high time scanning frequency). The selection of the corresponding battery cells is rotating because the high resolution cell-operating value profiles are not consistently needed for all battery cells.

Various aging state models are known for determining aging states for device batteries.

A possible aging state model may be provided in the form of a hybrid aging state model corresponding to a combination of a physical aging model with a data-based model. In a hybrid model, a physical aging state may be determined by means of a physical or electrochemical aging model, and a correction value resulting from a data-based correction model may be applied to said aging state, in particular by addition or multiplication. The physical aging model is based on electrochemical model equations that characterize electrochemical states of a non-linear differential equation system with regard to aging reactions, calculate them continuously in accordance with a time integration process, and maps them to the physical aging state for output, as SOH-C and/or as SOH-R. The calculations can typically be performed in the central unit (Cloud) at intervals of predetermined evaluation periods of e.g., once a week.

Furthermore, the correction model of the hybrid data-based aging state model may be designed with a probabilistic or artificial intelligence-based probabilistic regression model, in particular a Gaussian process model, and may be trained to correct the aging state obtained by the physical aging model. For this purpose, consequently there is a data-based correction model of the aging state for correcting the SOH-C and/or at least one further model for correcting the SOH-R. Possible alternatives to the Gaussian process are further supervised learning methods, such as based on a random forest model, an AdaBoost model, support vector machine, or a Bayesian neural network.

To monitor the individual battery cells of the device battery, the internal states of the physical aging model of the hybrid aging state model may be further developed in the central processing unit based on the cell-operating value profiles, e.g., starting from a commissioning point (start of life)/reference point by the time integration method, from which an aging state can be determined model-based. This assumes that cell-operating value profiles are continuous for all battery cells.

A base model may also be provided as a further model for determining an aging state, according to which an SOH-C measurement is made by Coulomb counting or by forming a timed current integral during the charging process, which is divided by the stroke of the charging state between the start and end of the respective charging and/or discharging phase. Advantageously, the calibration on the neutral voltage characteristic is carried out in idle phases in order to co-calculate the state of charge curve in the central processing unit. A sufficiently reliable indication of the state of aging can be obtained, for example, when the vehicle battery is brought from a defined relaxed state during a charging operation under reproducible load and ambient conditions from a fully discharged charging state to a fully charged state. Thereby, the maximum charge sensed may be related to an initial maximum charging capacity of the vehicle battery. Resistive aging states (SOH-R values) may also be calculated by voltage changes relative to a current change. Typically, these are related to a defined time interval as well as defined ambient conditions and the direction of energy flow of the system.

The central processing unit now provides for each device battery to monitor the cell aging states of the individual battery cells by providing an associated battery performance model and aging state model. These models are updated as soon as cell-operating value curves are available for the respective battery cell to allow for updating the internal state and cell aging state associated with the battery cell in question. A mapping of the device battery as a "digital twin" in the central processing unit is thus obtained, wherein an internal state and a cell aging state are indicated for each battery cell of the monitored device batteries.

This makes it possible to derive the aging state of the entire device battery from the individual cell aging states according to the topology or configuration, e.g. according to the rules of the Kirchhoff nodes and mesh rules (e.g., connection of capacities) in order to precisely determine the overall aging state.

According to the above method, it is now contemplated to perform transmission of the high-frequency scanned cell-operating value profiles for the battery cells of a device battery within a predefined period of time only for a selected portion of the battery cells.

This is done using an internal state of the battery cells and a cell aging state along with the corresponding confidence value. This confidence value is indicated, for example, in the data-based/hybrid aging state model by the confidence of the data-based correction model. Corresponding confidence values can also be determined in the electrochemical battery model and the base model by well-known methods for the respective state of aging. Generally, the method described below may be feasible with any aging state model that may provide a cell aging state at a particular analysis time along with confidence based on cell-operating value profiles.

A cell aging condition can now be provided to each battery cell, which results from one of the above aging models or results as a fused aging state by fusion of the evaluations of multiple aging models at particular analysis intervals. Accordingly, at the analysis time, a cell confidence value can be provided for each battery cell, which results from the corresponding aging model used to determine the aging state, or as a fused cell confidence value by fusion of the analyses of the aging models.

It may be provided that, as part of a rolling acquisition, the cell-operating value profiles of at least a part of the remaining battery cells are captured and provided with a high temporal resolution for the battery cells for the respective next evaluation period and the previously selected part of the battery cells is not captured or is captured and provided with the low temporal resolution.

If cell operating value curves for the one or more historical evaluation periods are missing, a cell aging state can alternatively be determined by prediction. This prediction is based on self-recognized prediction methods and provides, in addition to the predicted cell aging state at the end of the current evaluation period, a level of uncertainty and/or a confidence of the prediction.

To fuse cell aging states of a battery cell obtained with various aging state models, domain rules may be applied, such as e.g. the assumption that battery cells with a comparable stressed state (strains of battery current at similar temperatures) have also experienced comparable aging. The fusion may be performed with "fuzzy logic", for example, such that after a system level balancing operation, conditions are as uniform as possible, especially with respect to voltage.

It may be provided that an overall aging state of the device battery is determined from the cell aging states. This can be achieved by, for example, transforming all cell aging states from cell to pack or module level by the rules of Kirchoff. The simplest approach is to define the weakest cell as limiting to the entire device battery. Advantageously, domain knowledge on heat generation and derating strategy can be applied.

Selecting the portion of the battery cells may be performed according to information that indicates to what extent providing the high temporal resolution cell-operating value profiles contributes to an accurate determination of the overall aging state of the device battery.

In particular, to select the battery cells, a combinatorial optimization problem may be solved such that a predetermined number of battery cells are selected that maximize an information gain corresponding to a change in the information material when determining the overall aging state.

Differential entropy can be used as the information material, which results from determining the respective cell aging state with the one or more aging state models, depending on the cell age conditions and a corresponding level of uncertainty (confidence) for the respective modeled cell ageing state.

The selection of the battery cells, whose cell-operating value profiles are transferred to the Cloud, is thus carried out corresponding to an information level, which indicates to what extent a precise determination of a corresponding cell aging state contributes to a more accurate determination of the overall aging state of the device battery. In this context, it is evaluated how high the certainty of the calculation of the aging state over the analysis of the cell aging states (digital twin) is. The information yields the information content of the present cell-operating value curves of all battery cells for the entire device battery. In order to identify those battery cells for which cell-operating value profiles with a high temporal resolution are to be captured and/or provided, differential entropy is used as the information material.

Differential entropy may be used as the information material, which results depending on voltage differences between a cell voltage modeled using a battery performance model and a measured cell voltage for each of the battery cells.

Alternatively, differential entropy may be used as the information material, depending on the cell aging states and a corresponding measure of uncertainty for the respective modeled cell aging state resulting from the determination of the respective cell aging state with the one or more aging state models, e.g. from the use of a probabilistic regression model in an at least partially data-based aging state model.

The differential entropy may result from a level of uncertainty or confidence for the cell aging state of each battery cell as:

1. it is determined as a measure of uncertainty or confidence of the observational errors of the battery performance model. To this end, a battery voltage can be determined from a battery temperature and a battery current. The difference between the cell voltage thus modeled and the measured real cell voltage can be evaluated to determine the quality of the battery performance model associated with each battery cell in a model-based manner.

In particular, the battery cells may be selected for more accurate monitoring (by high-frequency scanning of the operating values) depending on their distances to a mean cell aging state of a device battery and/or the respective measures of uncertainty. The differential entropy for each cell ageing state results in:

$$h(X) = -\int_{-\infty}^{\infty} f_X(x)\log f_X(x)dx = E(-\log f_X(x))$$

wherein f(x) describes a probability density function corresponding to the normal distribution of the voltage error from a difference of modeled and measured cell voltage. The higher the difference, the higher the uncertainty and the lower the confidence. For a measurement with a high scanning frequency, the device batteries are now selected for which the expected information gain or the determined uncertainty is the highest.

2. If no or no significant differences in the measures of uncertainty or confidences result for all battery cells, alternatively or additionally, using the hybrid aging state model for each battery cell, the respective correction model for its uncertainty/confidence for each of the battery cells may be evaluated to assess the extent to which the determination of the overall aging state can be based on the cell aging states.

With the differential entropy (Shannon entropy), which is advantageously normalized, the information material of the provided cell-operating value profiles can be described with respect to determining the overall aging state of the device battery. Since by monitoring the cell aging states of the battery cells of the device battery in question in the central processing unit, the uncertainty of determining the aging state of the device battery at each time point can be quantified, a rolling confidence interval can be provided. This is usually based on a normal distribution corresponding to a continuous probability density function. Because each battery cell is monitored at least intermittently using the hybrid aging state model, the electrochemical battery model, and/or the base model, a cell aging state and a confidence value/ unsafe measure are available for each of the battery cells at an evaluation interval.

In consideration of the topology of the device battery and the system design, the uncertainties of the cell ageing states of all battery cells are now determined by solving a combinatorial optimization problem, the battery cells that maximize future information gain, preferably within a defined evaluation period, such as e.g. one or two weeks. Simple system models for physical evaluation can be used for this purpose.

For example, the differential entropies for each of the battery cells may be used to determine the expected gain of information for determining the overall aging state. The differential entropy may also be calculated and utilized at the module or packing level. Advantageously, the couplings resulting from the topology and circuitry of the battery cells are exploited here in accordance with the rules of the Kirchhoff nodes and meshes. Subsequently, a number of battery cells are selected that can provide the highest contribution or the highest information gain, i.e., whose differential entropy is maximum, for determining the overall aging state.

The expected information gain of a battery cell may be defined as the expected information that results when the cell-operating value profiles of the relevant battery cell are scanned at a high scanning frequency, e.g. 10 Hz for a certain period of time, e.g. for at least 3 hours (preferably a full day). In that case, namely, the battery performance model may be fitted to determine detailed kinetic parameters, i.e., internal states, with which the hybrid aging model may be calibrated.

For these selected battery cells, it is communicated to the relevant technical device that a scan is to be performed at the higher scanning frequency. The operating values of the remaining battery cells are then not scanned or only with a lower scanning frequency.

It may be contemplated that upon detection of a quiescent phase characterized by un-powered operation for at least a certain amount of time, balance or equilibrium parameters for the battery performance model, wherein internal states obtained by evaluating the battery performance model are used to calibrate a physical or electrochemical aging model for each of the battery cells.

Alternatively or additionally, depending on time cell-operating value profiles of operating values for each of the battery cells, kinetic, electrochemical model parameters for a battery performance model may be determined, wherein internal states obtained by evaluating the battery performance model are used to calibrate a physical or electrochemical aging model for each of the battery cells, respectively.

It may be contemplated that the one or more aging state models will operate based on electrochemical model parameters of the battery performance model.

Depending on a battery performance model fitted based on the cell operating value curves for each of the battery cells, internal states of the battery cells may be determined, wherein, depending on the internal state of the battery cell having the greatest cyclic aging, a charging profile for the device battery is derived, that has a maximum charging current, in particular as a function of the state of charge, in particular taking into account the anode potential of the battery cell in question.

Furthermore, an anomaly may be signaled when a battery cell is selected in sequence for a predetermined number of times.

The selection of the respective battery cells is communicated to the respective device with the respective device battery so that the device can be operated such that only the cell-operating values of the selected battery cells are captured at a high temporal resolution and transmitted to the central unit via the communication link. At the end of the defined evaluation period or after repeated execution of the method described above, the selection of the battery cells to be monitored can be changed.

The above method may be performed in a central processing unit, wherein the cell-operating value profiles of the selected battery cells are received from an external device with the high temporal resolution for the next evaluation period of time.

In another aspect, a method of operating a device with a device battery is provided, wherein an indication for selecting battery cells of the device battery is received from a central processing unit, wherein the selected battery cells are measured at a high resolution and the resulting cell-operating value profiles are transmitted to the central processing unit, while for the remaining battery cells of the device battery no operating values or cell-operating value profiles with low temporal resolution are captured.

BRIEF DESCRIPTION OF THE DRAWINGS

Embodiments are described in more detail below with reference to the accompanying drawings. Here.

DETAILED DESCRIPTION

In the following, the method according to the disclosure is described with reference to vehicle batteries as device batteries in a plurality of motor vehicles as similar devices. For this purpose, one or more aging state models are operated in the central processing unit and used for the calculation of aging and, if necessary, aging prediction. In the central processing unit, the aging state models are continuously updated or re-trained based on operating values of the vehicle batteries from the vehicle fleet.

The example above is representative of a plurality of stationary or mobile devices with a network-independent energy supply, such as vehicles (electric vehicles, pedelecs, etc.), systems, machine tools, household appliances, IoT devices, and the like, which are connected via a corresponding communication connection (e.g., LAN, Internet) to an external central unit (Cloud).

Figure 1:
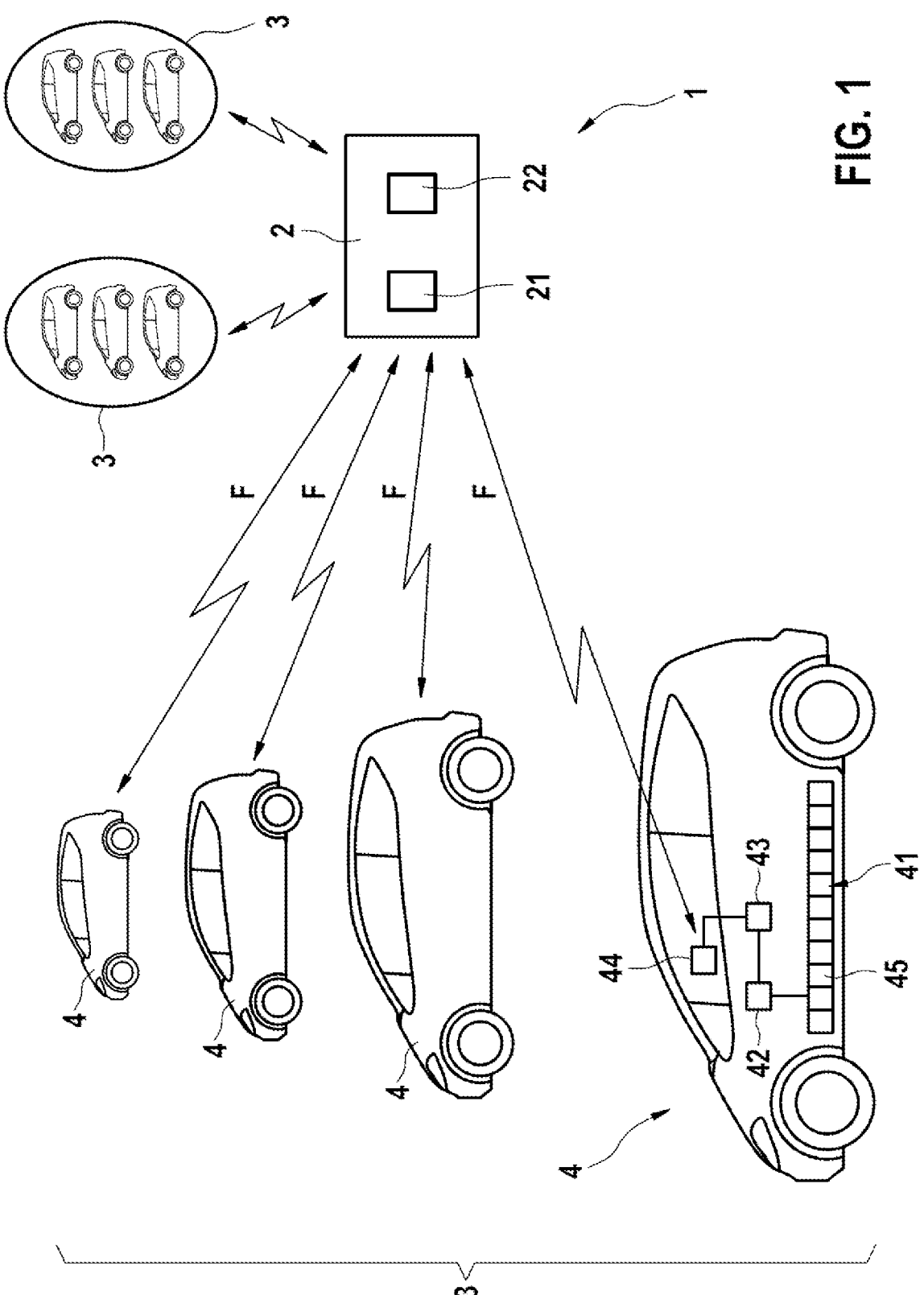
FIG. 1 shows a schematic illustration of a system for providing driver-specific and vehicle-specific operating values for determining an aging state of a vehicle battery in a central unit.

FIG. 1 shows a system 1 for collecting fleet data in a central unit 2 for creating and for operating as well as for evaluating a battery performance model and an aging state model. The aging state model is used to determine an aging state of battery cells of the vehicle battery in a motor vehicle. FIG. 1 shows a vehicle fleet 3 with a several motor vehicles 4. The battery performance model serves to model internal states of the battery cells of the vehicle battery.

One of the motor vehicles 4 is shown in more detail in FIG. 1. The motor vehicles 4 each comprise a vehicle battery 41, an electric drive motor 42 and a control unit 43. The control unit 43 is connected to a communication system 44, which is suitable for transmitting data between the respective motor vehicle 4 and a central unit 2 (a so-called cloud).

The vehicle battery 41 includes a plurality of battery cells 45 that are to be monitored for loading and aging states according to methods described below.

The controller 43 is particularly configured to provide data for selected, selectable, or all battery cells 45 having a high temporal resolution, such as between 1 and 50 Hz, such as e.g. 10 Hz, and transmits such to the central processing unit 2 via the communication device 44.

The motor vehicles 4 send the operating values F to the central unit 2, which indicate at least values that affect the aging state of the vehicle battery 41, and which are required for a determination of the internal states of the battery cells 45. In the case of a vehicle battery, the operating values F can indicate an instantaneous battery current, an instantaneous battery voltage, an instantaneous battery temperature and an instantaneous state of charge (SOC), at the pack, module and/or cell level. The operating values for the battery cells 45 are hereinafter referred to as cell-operating values. The cell-operating values F are sensed in a fast time grid from 0.1 Hz to 50 Hz and can be transmitted regularly to the central unit 2 in uncompressed and/or compressed form. For example, by using compression algorithms, the time series may be transmitted to the central unit 2 in blocks at intervals of 10 min to several hours in order to minimize the data traffic to the central unit 2.

Furthermore, the controller 43 may receive information about the selection of battery cells 45 to be captured at the high temporal resolution while not capturing the cell-operating values for the remaining battery cells 45, or only at a lower temporal resolution. This allows for a significant reduction of the amount of data to be transmitted to the central processing unit 2. If not all battery cells 45 require the cell-operating values with a high temporal resolution, then scanning of the remaining battery cells 45 whether or not with a lower temporal resolution cannot be performed device-internally, in order to also unload an internal vehicle bus of the vehicles 4 accordingly.

The central unit 2 comprises a data processing unit 21, in which the method described below can be performed, and a database 22 for storing data points, model parameters, states, and the like.

An aging state model is implemented, which may be partially data-based as a hybrid model, in the central unit 2. The aging state model may be used regularly, i.e., for example, after the respective evaluation period has elapsed, in order to determine the instantaneous cell-aging state of the relevant vehicle battery 41 of the associated vehicle fleet based on the time profiles of the cell-operating values (in each case since the initial operation of the respective vehicle battery) and features determined therefrom. In other words, it is possible to determine an aging state of the relevant vehicle battery 41 based on the profiles of the cell-operating values of one of the vehicle batteries 41 of the motor vehicles 4 of the associated vehicle fleet 3 and the cell-operating values resulting from these operating value profiles. An overall state of aging of the vehicle battery can be determined from the cell aging states based on the X Kirchhoff node and mesh rules. Alternatively, the total aging state may correspond to the minimum cell aging state.

The central processing unit 2 is configured to receive the cell-operating value profiles and model a digital twin for each vehicle 4 or vehicle battery 41, respectively. For each battery cell 45 of vehicle battery 41, the digital twin determines a current cell aging state using the hybrid aging state model and continues to update it based on the cell-operating value profiles of the cell-operating values. Further, for each battery cell 45 of vehicle battery 41, the digital twin provides a battery performance model that models, by its model parameters, an internal state of the battery cell that can be updated by time intervals of the cell-operating value profiles. Further, from the cell aging states of the battery cells 45 of the vehicle battery 41 and the corresponding confidence values for determining the aging state, the central unit 2 can make a selection of the battery cells 45 that are to be monitored in sequence, while the remaining battery cells are not to be monitored or only with a lower temporal resolution.

The aging state (state of health, SOH) is the key variable to indicate a remaining battery capacity or remaining battery charge. The aging state represents a measure of the aging of the vehicle battery or of a battery module or of a battery cell and may be indicated as a capacity retention rate (SOH-C) or as an increase in internal resistance (SOH-R). The capacity retention rate SOH-C is given as the ratio of the measured instantaneous capacity to an initial capacity of the fully charged battery. The relative change in the internal resistance SOH-R increases with increasing aging of the battery.

Figure 2:
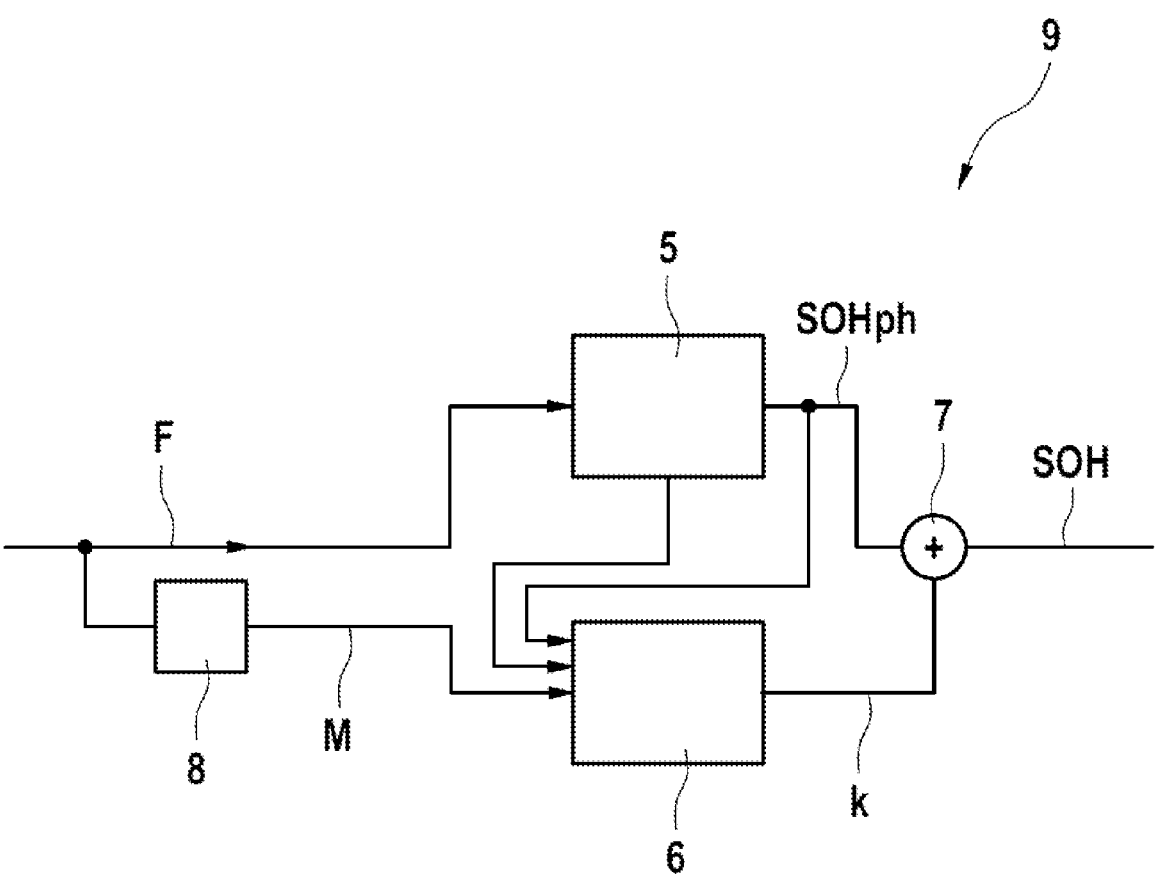
FIG. 2 shows a schematic illustration of a functional structure of a hybrid aging state model.

FIG. 2 schematically shows, by way of example, the functional structure of an embodiment of a data-based aging state model 9 structured in a hybrid manner. The aging state model 9 comprises a physical aging model 5 and a data-based correction model 6.

The physical aging model 5 is a non-linear mathematical model based on differential equations. The evaluation of the physical aging model of the aging state model with cell-operating value profiles, in particular since the start of the service life of the device battery, results in an internal state of the equation system of the physical differential equations that corresponds to a physical internal state of the device battery. Since the physical aging model is based on physical and electrochemical principles, the model parameters of the physical aging model are values that indicate physical properties.

The time series of the operating values F of the device battery (in case of total battery consideration) or the cell-operating values of the battery cells (in case of an individual assessment of the battery cells) are thus directly included in the physical aging state model 5, which is preferably modelled as an electrochemical model and describes corresponding internal electrochemical states, such as layer thicknesses (e.g., SEI thickness), change in cyclable lithium due to anode/cathode side reactions, rapid consumption of electrolytes, slow consumption of electrolytes, loss of active material in anode, loss of active material in cathode, etc., by means of non-linear differential equations and a multi-dimensional state vector.

The physical aging model 5 thus corresponds to an electrochemical model of the respective battery cells and of the cell chemistry. This model determines, depending on the cell-operating values F, internal physical battery states in order to provide a physically based aging state SOHph of the dimension of at least one in the form of the electrochemical states mentioned above, which are mapped linearly or non-linearly to a capacity retention rate (SOH-C) and/or an internal resistance increase rate (SOH-R) in order to provide the later as an aging state (SOH-C and SOH-R).

However, the model values for the physical aging state SOHph provided by the electrochemical model are inaccurate in certain situations and it is therefore provided to correct them with a correction value k. The correction value k is provided by the data-based correction model 6, which is trained by means of training data sets from the vehicles 4 of the vehicle fleet 3 and/or by means of laboratory data.

On the input side, the correction model 6 receives operating features M, which can be determined by operating values/cell-operating values from the profiles of the operating values F and can also comprise one or more of the internal electrochemical states of the differential equation system of the physical model. Furthermore, the correction model 6 may receive on the input side the physical aging state SOHph obtained from the physical aging model 5. The operating features M of the current evaluation period are generated in a feature extraction block 8 based on the time series of the cell-operating values F. The operating features M furthermore include the internal states from the state vector of the electrochemical physical aging model as well as, advantageously, the physical aging state SOHph.

From the operating values/cell-operating values F, operating features M relating to an evaluation period can be generated in the central unit 2 for each vehicle fleet 3 or in other embodiments even already in the respective motor vehicles 4. The evaluation period for determining the aging state may be a few hours (e.g., 6 hours) to several weeks (e.g., one month). A typical value for the evaluation period is one week.

The operating features M may, for example, comprise features relating to the evaluation period and/or accumulated features and/or (for individual battery assessment or total battery assessment) statistical variances determined over the entire previous service life or aggregate variances. Especially, the operating characteristics contain for example: electrochemical states, such as SEI layer thickness, change of cyclable lithium due to anode/cathode side reactions, rapid absorption of electrolyte solvent, slow absorption of electrolyte solvents, lithium deposition, loss of active anode material and loss of active cathode material, information on impedances or the internal resistances, histogram features, such as temperature over state of charge, charging current over temperature and discharging current over temperature, in particular multi-dimensional histogram data with respect to the battery temperature distribution over the state of charge, the charging current distribution over the temperature and/or the discharging current distribution over the temperature, the current flow rate in ampere-hours, the accumulated total charge (Ah), an average increase in capacity during a charging operation (in particular for charging operations in which the charge increase is above a threshold fraction [e.g., 20% $\Delta SOC$] of the total battery capacity), the charging capacity as well as an extreme value (e.g., maximum) of the differential capacity during a measured charging operation with sufficiently large stroke of the state of charge (smoothed profile of dQ/dU: charge change divided by change in the battery voltage) or the accumulated driving power. These values are preferably converted such that they optimally characterize the real usage behavior and are standardized in the feature space. The operating features M may be used altogether or only in part for the method described below.

For the determination of a corrected aging state SOH to be output, the outputs SOHph, k of the physical aging model 5 and of the data-based correction model 6, which is preferably designed as a Gaussian process model, are applied together. In particular, they can be added or otherwise also multiplied (not shown) in a summing block 7 in order to obtain the modeled aging state SOH to be output for a current evaluation period. The confidence of the Gaussian process may still be used in the addition case as the confidence of the corrected aging value SOH of the hybrid model to be output. The confidence or the confidence value of the Gauss process model thus characterizes the modeling uncertainty of mapping operational feature points to an aging state.

The calculation of the aging state and the prediction of the aging state are therefore possible for vehicle batteries with battery cells. The method is also applicable to the overall system of the vehicle battery 41 by way of control and/or data-based mapping. For batteries, generally, determining the aging state for the battery cells may also be applied directly at the module level and packing level.

Training of the hybrid aging state model is carried out in the central processing unit 2. For this purpose, training data sets are defined that associate cell-operating value profiles with an empirically or model-based determined aging state as a label.

For example, to determine an aging state as a label for training the hybrid or data-based aging state model, a base model may be provided according to which SOH-C measurement is measured by Coulomb Counting or by forming a timed current integral during the charging process, which is divided by the lift of the state of charge between the start and the end of the respective charging and/or discharging phase. A sufficiently reliable indication of the state of aging can be obtained, for example, when the vehicle battery is brought from a defined relaxed state during a charging operation under reproducible load and ambient conditions from a fully discharged charging state to a fully charged state. Thereby, the maximum charge sensed may be related to an initial maximum charging capacity of the vehicle battery. Resistive aging states (SOH-R values) may also be calculated by voltage changes relative to a current change. Typically, these are related to a defined time interval as well as defined ambient conditions and the direction of energy flow of the system.

Determining an aging state as a label can be done in a manner known by way of evaluation of the cell-operating value profiles with an additional aging model in the vehicle or in the central unit 2 under defined load and environmental conditions of a label generation, such as in a workshop on a test bench or diagnostic or label generating mode, which represents an operation mode and maintaining predetermined operating conditions of the vehicle battery, such as constant temperature, constant current and the like. Other models may be used to determine aging. Training of the data-based correction model may be performed in a conventional manner based on the training records.

The electrochemical battery performance model may be adapted to the cell-operating value profiles at resting phases, e.g., using a least square method or the like. Based on the battery performance model, the battery cells may be determined based on the fit electrochemical model parameters of the cell aging state. The electrochemical battery performance model may model equilibrium states and be described by model parameters. The model parameters may be re-parameterized at regular intervals, particularly when there are high scanning frequency cell operating value curves for a defined time period of at least a few (e.g., three) hours. This data may be collected for similar vehicle batteries 41 by evaluation in the central processing unit 2 and adjustment or re-parameterization can be performed there.

By fitting the electrochemical battery performance model, especially with respect to the kinetic parameters (determining an internal state) and then calibrating based on high-resolution time series of the battery performance model, it is not necessary to record all cell operational quantity profiles in high-resolution and transfer them to the central unit in order to determine a cell aging state. Finally, a rolling load on the vehicle bus always takes place with the focus on the most relevant battery cells so that the data transfer can be significantly reduced. By regularly calibrating the battery performance model and evaluating the hybrid aging state model in the digital twin and the accompanying rolling switching on and off of the high scanning of the cell-operating value profiles of individual battery cells, the data load in the vehicle, e.g. on the CAN bus, can be minimized. This is because the high-resolution cell-operating value curves are now no longer required continuously, but only for calibration via the battery performance model. Thus, internal conditions of the electrochemical or hybrid aging model can be calibrated and, if necessary, re-enacted according to an observer principle, so that the slowly changing aging state can be re-enacted for all battery cells.

Such model parameters of the battery performance model may include, for example, a scale indication of the cyclable lithium (value refers to the cathode capacity), the proportion of the cyclable lithium at the start of life of the battery (scale value), a volume fraction of the anode, and a volume fraction of the anode at the start of life of the device battery. The aging state may be determined approximately as a linear combination of the internal equilibrium states.

To evaluate the electrochemical battery performance model, cell-operating value curves are typically only necessary for a short period of time, for example a few hours, to create a state vector of kinetic and equilibrium states, which may be highly accurate in indication of the cell aging state.

Figure 3:
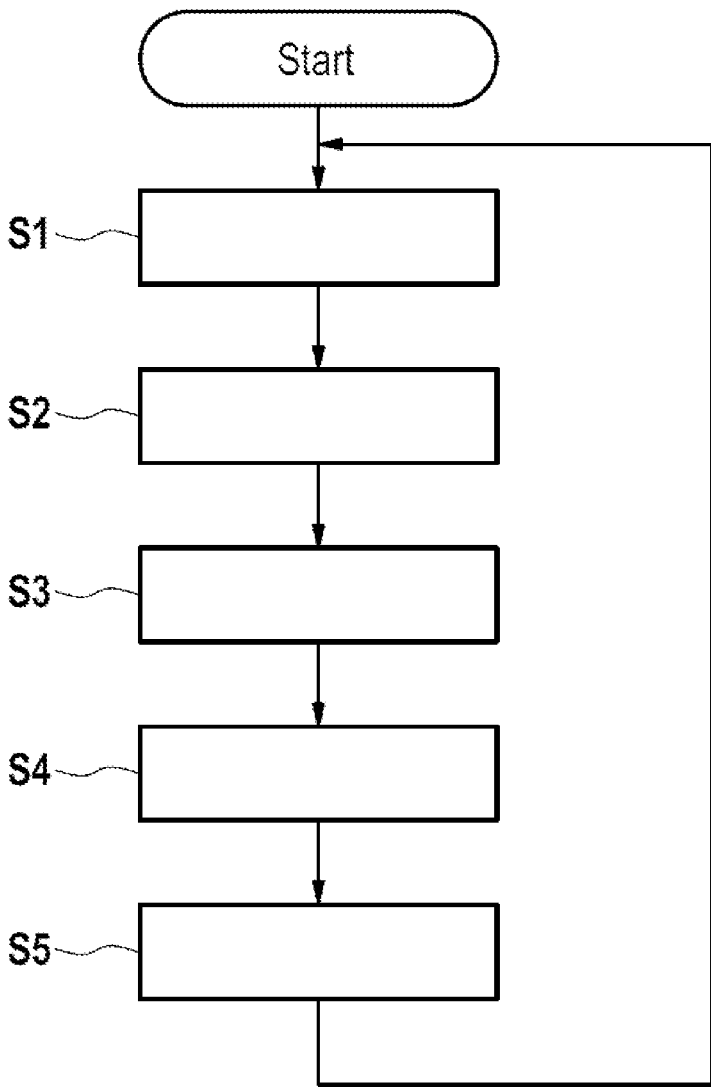
FIG. 3 shows a diagram of a flow chart illustrating a method for monitoring cell aging states of individual battery cells of vehicle batteries.

In the following, the method for monitoring and determining the cell aging states of individual battery cells 45 of vehicle batteries 41 of a plurality of vehicles 4 in the central processing unit 2 will be described in more detail based on the flow diagram of FIG. 3. The method assumes a system state in which a so-called digital twin is maintained in the central processing unit 2 for each of the vehicle batteries 41. The digital twin represents a data set comprising, for each battery cell 45 of the vehicle battery 41, a cell aging state and the cell-operating value profiles of the cell current, the cell voltage and the cell temperature captured or modeled so far.

Furthermore, the digital twin includes the model parameters of a battery performance model that can be adjusted or updated for the corresponding battery cells upon the presence of temporally high resolution cell-operating value profiles. For monitoring the cell aging states of the individual battery cells 45, it is sufficient according to the method proposed herein to capture cell-operating value profiles of high temporal resolution for periods of time, for example between three hours and two weeks, and not to provide cell-operating value profiles or cell-operating value profiles of lower temporal resolution outside of these periods.

In step S1, cell-operating value profiles with a high temporal resolution of, for example 10 Hz are first recorded for selected battery cells and provided in the central processing unit 2. The cell-operating values correspond to the cell current, the cell temperature, which generally corresponds to the battery temperature, the battery voltage, and the state of charge, if any. The selected battery cells 45 have been transmitted from the central processing unit 2 to the relevant vehicle according to the last selection. The transmission of cell-operating value profiles can be in block fashion and can be in compressed form, e.g. cell-operating value profiles can be compressed within the last 30 minutes and transmitted to the central processing unit 2 in block fashion. In the central processing unit 2, the cell-operating value profiles are assembled and stored correspondingly with reference to the relevant battery cell 45. Data processing is performed including outlier detection, filtering, and data cleanup, interpolation, or the like.

In step S2, with respect to all battery cells 45 for which the cell-operating value profiles have not been received in high temporal resolution, i.e. for the non-selected battery cells 45, a scan with lower temporal resolution, such as with 1 Hz, is performed. This allows the previous cell-operating value profiles captured for the battery cells in question to be supplemented with generated cell-operating value profiles up to the current time. For this purpose, the aging state model used or the aging state method used is calculated or extrapolated based on the low-scanned cell-operating value profiles, if available. The battery performance model can be used for the simulation, even if there are no signals with high resolution in time. For example, the cell-operating value profiles in low temporal resolution may include discrete values of the cell voltage and/or temperature at rest (battery un-powered state).

Subsequently, in step S3, cell aging states are now determined using the hybrid aging state model. The application of the hybrid model, in particular the correction model, in addition to the current state of aging, also provides a measure of uncertainty that can be determined directly from the analysis by the Gauss process model (probabilistic regression model).

Optionally, based on other aging state models, or by fusion of aging states obtained from multiple aging state models, the cell aging states and a corresponding measure of uncertainty may also be determined.

From the aging states determined in this way, an overall aging state can now be determined in step S4 by transforming all the aging states at the cell level from cell to pack level by Kirchoff's rules. The simplest approach is to define the weakest cell as limiting for the pack/module. Advantageously, domain knowledge on heat generation and derating strategy can be applied.

Subsequently, in step S5, a selection of the battery cells 45 can be made for which cell-operating value profiles are to be subsequently recorded or provided with a high temporal resolution in order to improve the determination of the cell aging state for the battery cells 45 in question. This precise determination of the cell aging state for the selected battery cells 45 is intended to enable an improved determination of the overall aging state of the device battery.

To this end, for those battery cells for which there are high temporal resolution cell-operating value profiles, the battery performance model may be fitted or adjusted so that electrochemical, kinetic parameters (internal state) may be derived, e.g., electrolyte concentrations, reaction rates, layer thicknesses, porosities, etc. These parameters may be used to track or calibrate the hybrid aging state model, particularly the physical aging model, in observer mode. Alternatively, the parameters may also be employed to determine an aging state which may be used as a label, alternatively or in addition to training the hybrid aging state model.

In addition to the high-resolution calibration on the basis of kinetic parameters, the abutment of electrochemical equilibrium or equilibrium parameters takes place using the battery performance model, which may include cyclable lithium as well as volume fractions to the anode and cathode.

Thus, internal states of the electrochemical or hybrid aging model can be calibrated or tracked according to an observer principle, which allows a highly accurate state in the digital twin.

To select those battery cells for which cell-operating value profiles with a high temporal resolution are to be acquired, an information material is determined. The information material indicates to what extent a provision of the cell-operating value profiles with a high temporal resolution contributes to an accurate determination of the overall aging state of the device battery.

The determination is made by solving an optimization problem to maximize the information material representative of the states of all battery cells 45 of vehicle battery 41. For example, the differential entropy may be determined as the information material, which may be determined based on the normalized uncertainty measures for the aging states of the battery cells. The information material may thus correspond to the Shannon-entropy and is applied to the sum of all battery cells. Because the probabilistic regression model of the correction model of the hybrid aging state model statistically quantifies the measure of uncertainty at each time point, a rolling confidence interval may be provided. This is usually based on a normal distribution, which is available for each battery cell of the vehicle battery and can be converted as an information material in the form of differential entropy.

Now, taking into account the topology and system design, based on the uncertainty measures of the correction models for all battery cells of a relevant vehicle battery 41 to solve the combinatorial optimization problem, those battery cells 45 that maximize the information gain can be determined when monitored at a high temporal resolution in a subsequent evaluation period, such as for example two weeks.

Alternatively, as a measure of uncertainty, the observational error of the battery performance model, which assigns a battery temperature and a battery current to a battery voltage and a state of charge using an equivalent circuit diagram, can be evaluated for the measured real battery voltage to evaluate the quality of the battery performance model associated with the respective battery cell based on current operating values. For example, differential entropy may also be used as information material, which may be determined based on the normalized measures of uncertainty for cell voltage modeling of the battery cells. In other words, the differences (voltage errors) between the measured cell voltage and the cell voltage modeled using the battery performance model may be evaluated. The differential entropy for each cell state results in:

$$h(X) = -\int_{-\infty}^{\infty} f_X(x)\log f_X(x)dx = E(-\log f_X(x))$$

wherein f(x) describes a probability density function corresponding to the normal distribution of the voltage error from a difference of modeled and measured cell voltage. The higher the difference, the higher the uncertainty and the lower the confidence. For a measurement with a high scanning frequency (high temporal resolution), the device batteries are now selected where the expected information gain or the determined uncertainty is the highest, specifically the battery cells with the highest voltage errors.

The number of battery cells 45 to be selected is substantially freely selectable and may, for example, be between 3 and 20. The selection of the battery cells 45 determined in this way is communicated to the relevant vehicle 4 so that the selected battery cells 45 are now monitored there with a high temporal resolution, while the remaining battery cells 45 are monitored with a lower temporal resolution or not at all.

The method then continues in Step S1.

Furthermore, an anomaly detection can be performed by analyzing the battery cells according to their cell-aging states and their information materials. As a result, for the cells with the worst cell aging condition, which according to their information level cannot provide the desired information with accurate monitoring, i.e., that the battery cell behavior does not fit the model, an anomaly marking or signaling can take place. For example, if a battery cell is over a predetermined number (e.g., 10 times) of successive runs of the above method, signaling of an anomaly to the driver or fleet operator may take place.

Additionally, charging profiles can be adjusted based on the internal states of the battery cells of the digital twin. In particular, the charging profile, which indicates a maximum charging current, in particular as a function of the charging state, can be carried out depending on the internal states and the cell aging states of all battery cells, especially taking into account the potential for the "least" battery cell, i.e. the cell with the worst aging state. The adjustment of the charging profile can be based on the modeled state or SOH uncertainty in the digital twin.

What is claimed is:

1. A method of monitoring a plurality of battery cells of a device battery and continuously providing cell aging states of battery cells of the plurality of battery cells, the method comprising:

providing operating values for each of the battery cells of the plurality of battery cells to corresponding cell-operating value profiles of a plurality of cell-operating value profiles;

determining first cell aging states of each battery cell of the plurality of battery cells based on at least one aging state model, using the operating values of all of the cell-operating value profiles of the plurality of cell-operating value profiles during an evaluation period of a plurality of evaluation periods;

selecting a portion of the battery cells for continuously capturing operating values and providing the operating values to corresponding cell-operating value profiles of the plurality of cell-operating value profiles for use in a next evaluation period of the plurality of evaluation periods, wherein the selected portion of the battery cells does not include all of the battery cells of the plurality of battery cells;

continuously acquiring the additional operating values of the selected portion of the battery cells for use in the next evaluation period, while for remaining battery cells of the plurality of battery cells other than the selected portion no operating values are acquired or provided to corresponding cell-operating value profiles of the plurality of cell-operating value profiles, determining second cell aging states of each battery cell of the plurality of battery cells based on the at least one aging state model, using the operating values of all of the cell-operating value profiles of the plurality of cell-operating value profiles in the next evaluation period;

determining internal states of the battery cells for each of the battery cells depending on a battery performance model fitted based on the cell-operating value profiles;

deriving a charging profile for the device battery that has a maximum charging current as a function of a state of charge based upon an anode potential of a relevant battery cell of the plurality of battery cells depending on the internal states of a battery cell of the plurality of battery cells having a greatest cyclic aging; and charging the device battery based on the derived charging profile.

2. The method according to claim 1, wherein, as part of a rolling acquisition, the operating values of the cell-operating value profiles of the remaining battery cells are acquired and provided for a further evaluation period of the plurality of evaluation periods that is after the next evaluation period, and the additional operating values of the corresponding cell-operating value profiles of the selected portion of the battery cells are not acquired or provided for use during the further evaluation period.

3. The method according to claim 1, wherein:

an overall aging state of the device battery is determined from the first and the second cell aging states, and selecting the selected portion of the battery cells includes selecting the selected portion of the battery cells according to an information material that indicates to what extent a provision of the corresponding cell-operating value profiles contributes to an accurate determination of the overall aging state of the device battery.

4. The method according to claim 3, wherein selecting the selected portion of the battery cells comprises:

solving a combinatorial optimization problem such that a predetermined number of the battery cells are selected that maximize an information gain corresponding to a change in the information material when determining the overall aging state.

5. The method according to claim 3, wherein a differential entropy is used as the information material, which is determined depending on the first and the second cell aging states and a corresponding measure of uncertainty for the respective modeled cell aging state that results from determining the respective cell aging state with the at least one aging state model.

6. The method according to claim 3, wherein a differential entropy is used as the information material that results depending on voltage differences between a cell voltage modeled using a battery performance model and a measured cell voltage for each of the battery cells.

7. The method according to claim 1, wherein:

upon detection of a quiescent phase characterized by un-powered operation for at least a particular amount of time, equilibrium or equilibrium parameters are obtained for a battery performance model; and internal states obtained by evaluating the battery performance model are used to calibrate a physical or electrochemical aging model for each of the battery cells.

8. The method according to claim 1, wherein:

kinetic electrochemical model parameters for a battery performance model are determined for each of the battery cells depending on temporal cell-operating value curves; and internal states obtained by evaluating the battery performance model are used for calibrating a physical or electrochemical aging model for each of the battery cells.

9. The method according to claim 7, wherein the at least one aging state model operate based on electrochemical model parameters.

10. The method according to claim 3, wherein an anomaly is signaled when a battery cell is selected in sequence for a predetermined number of times.

11. The method according to claim 1, wherein:

the method is performed in a central processing unit; and the cell-operating value profiles of the selected battery cells are received from an external device with high temporal resolution for the next evaluation period.

12. A method of operating a device with a device battery having a plurality of battery cells, the method comprising:

receiving an indication for selecting a first portion of battery cells of the plurality of battery cells from a central processing unit;

selecting the first portion of battery cells based upon the received indication, wherein the first portion of the battery cells does not include all of the battery cells of the plurality of battery cells;

measuring operating values of the selected first portion of battery cells and providing the measured operating values to corresponding cell-operating value profiles for each of the first portion of battery cells;

transmitting the cell-operating value profiles of the first portion of the battery cells to the central processing unit, wherein for battery cells of the device battery which are not part of the selected first portion, no operating values or cell-operating value profiles are transmitted to the central processing unit;

determining cell aging states of each battery cell of the plurality of battery cells based on at least one aging state model, using the operating values of the cell-operating value profiles of the plurality of cell-operating value profiles after a respective evaluation period of a plurality of evaluation periods;

determining internal states of the battery cells for each of the battery cells depending on a battery performance model fitted based on the cell-operating value profiles;

deriving a charging profile for the device battery that has a maximum charging current as a function of a state of charge based upon an anode potential of a relevant battery cell of the plurality of battery cells depending on the internal states of a battery cell of the plurality of battery cells having a greatest cyclic aging; and charging the device battery based on the derived charging profile.

13. A device configured to perform the method according to claim 1.

14. A non-transitory machine-readable storage medium comprising instructions that, when executed by at least one data processing device, cause the at least one data processing device to perform the method as claimed in claim 1.

\*  \*  \*  \*  \*